United States Patent [19]

Johnson

[11] 4,178,567

[45] Dec. 11, 1979

[54] PERIOD-MODULATED VOLTAGE CONTROLLED OSCILLATOR

[75] Inventor: Richard A. Johnson, Long Beach, Calif.

[73] Assignee: Scientific Drilling Controls, Irvine, Calif.

[21] Appl. No.: 903,011

[22] Filed: May 4, 1978

[51] Int. Cl.² .............................................. H03B 3/04
[52] U.S. Cl. ................................ 331/177 R; 307/228; 331/74; 331/116 R
[58] Field of Search ................ 331/117 R, 117 V, 74; 324/78 R, 78 D; 328/48; 307/228

[56] References Cited

U.S. PATENT DOCUMENTS

| | | | |
|---|---|---|---|
| 3,351,873 | 11/1967 | Kimura | 307/228 X |
| 3,568,086 | 3/1971 | Perry | 331/177 X |
| 3,842,371 | 10/1974 | Kelley | 331/177 R X |

Primary Examiner—Siegfried H. Grimm
Assistant Examiner—Edward P. Westin
Attorney, Agent, or Firm—William P. Green Funk

[57] ABSTRACT

An oscillator for producing an output whose frequency varies in correspondence with changes in the level of an input voltage, and which includes a base or clock oscillator operating at a fixed frequency, a counter operable to count a predetermined number of oscillations of said base oscillator to thereby measure a base time period, a ramp generator controlled by the input voltage signal and acting to produce a voltage ramp continuing for a period whose duration varies in accordance with variations in the level of the voltage signal, and means for producing an oscillating output signal having a period which includes a combination of the base period as determined by the counter and the variable period measured by the ramp generator.

15 Claims, 3 Drawing Figures

PERIOD-MODULATED VOLTAGE CONTROLLED OSCILLATOR

BACKGROUND OF THE INVENTION

This invention relates to improved oscillators for producing an output signal oscillating at a frequency varying in correspondence with changes in the level of an input voltage signal.

Copending U.S. patent application Ser. No. 902,687 filed May 4, 1978 by Bernard R. Zuvela et al on "Remote Well Signalling Apparatus and Methods" discloses a well signalling system in which information is conveyed upwardly from deep within a well to the surface of the earth by frequency modulated signal currents transmitted through the earth formation surrounding the well. The oscillating signal currents in the earth desirably vary in frequency within a rather narrow range, and may be produced by a voltage controlled oscillator in which the frequency and period of the output signal vary in correspondence with changes in the input voltage level. In order to assure proper interpretation of the frequency modulated signals at the surface, the voltage controlled oscillator must be very precise and reliable in its regulation of the output frequency, and preferably is essentially linear in response.

SUMMARY OF THE INVENTION

The voltage controlled oscillator of the present invention has in certain respects been especially designed to satisfy the very exacting requirements of the above-discussed well signalling environment, though it will be apparent that an oscillator embodying the invention can also serve any of numerous other purposes. The present oscillator is very precise, reliable and stable in operation, may function within a narrow range of frequencies, and may be linear in character. In addition, the circuit may be easily converted, in a very simple and straightforward manner, to produce an output in any of various different frequency ranges, without major circuit disruption, while in each of these ranges the circuit has the discussed precision of response, stability and reliability.

These results are achieved in large part by the provision of circuitry in which two measured time periods are combined, to arrive at a composite period which is then used for determining either directly or indirectly the period and frequency of the output oscillations. One of the two component periods is of precisely fixed duration, to establish an unvarying base period, with which a variable second component period is combined. The period of fixed duration is established precisely by provision of a base or clock oscillator and a counter designed or programmed to count a predetermined number of oscillations from that clock. The duration of the variable component period is established by a ramp generator or integrator, which slews between two different voltages for an interval whose duration is dependent on the level of the voltage input signal. The clock and counter thus function to establish the frequency range for the output signal from the system, with that frequency range being easily changeable by merely changing the fixed frequency of the base oscillator, and/or by reprogramming of the counter or substituting another counter designed to produce an output at a different number of oscillations of the base oscillator. In combining the two component periods, these periods are preferably added together, to produce a composite period longer than either of the two components separately. It is contemplated broadly, however, that if desired the two components may in some instances be combined by subtracting one of the periods from the other.

BRIEF DESCRIPTION OF THE DRAWINGS

The above and other features and objects of the invention will be better understood from the following detailed description of the typical embodiment illustrated in the accompanying drawings in which.

DESCRIPTION OF THE PREFERRED EMBODIMENT

Figure 1A:
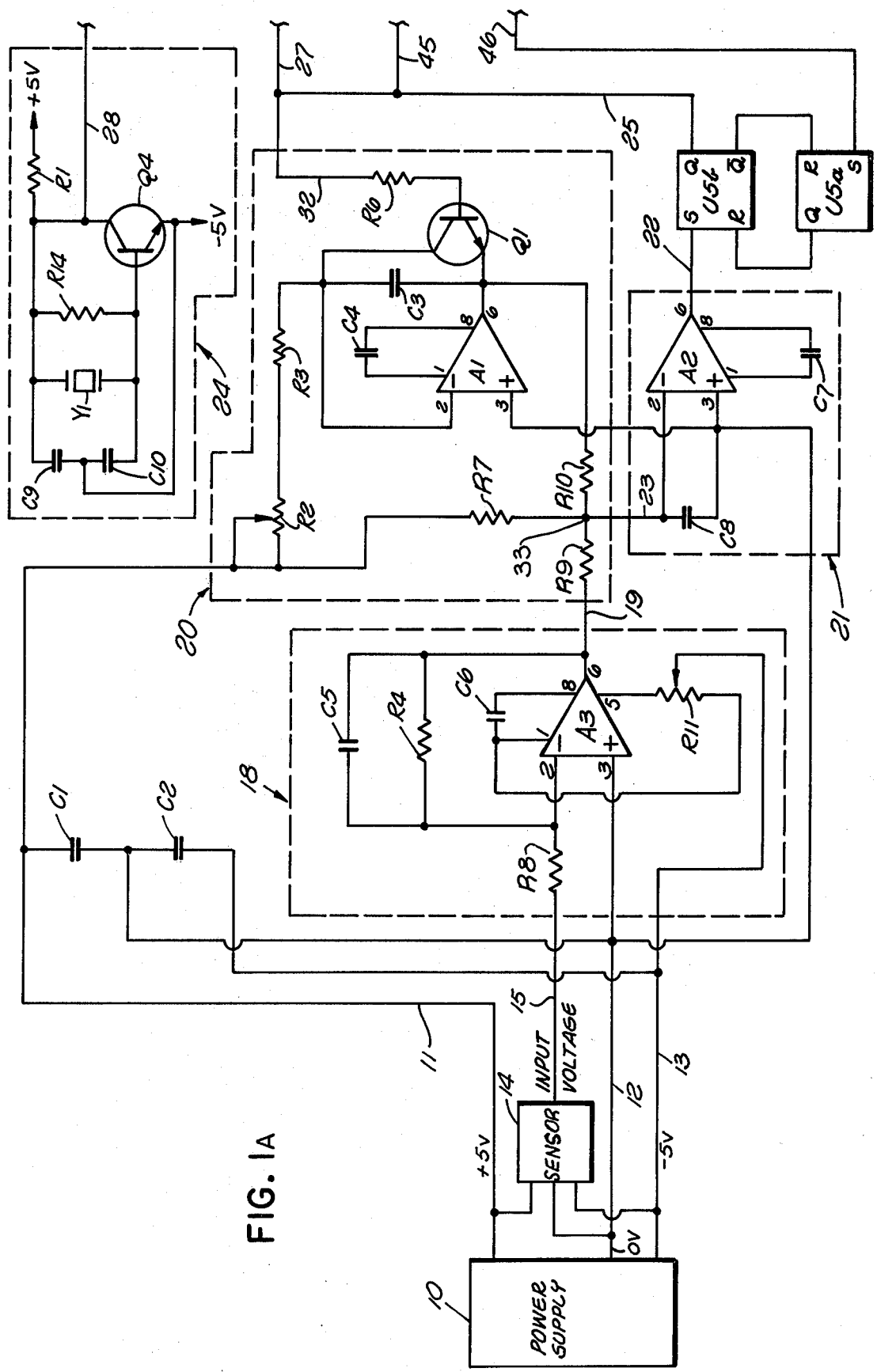
FIGS. 1A and 1B form together a circuit diagram of a period-modulated voltage controlled oscillator embodying the invention.
Figure 1B:
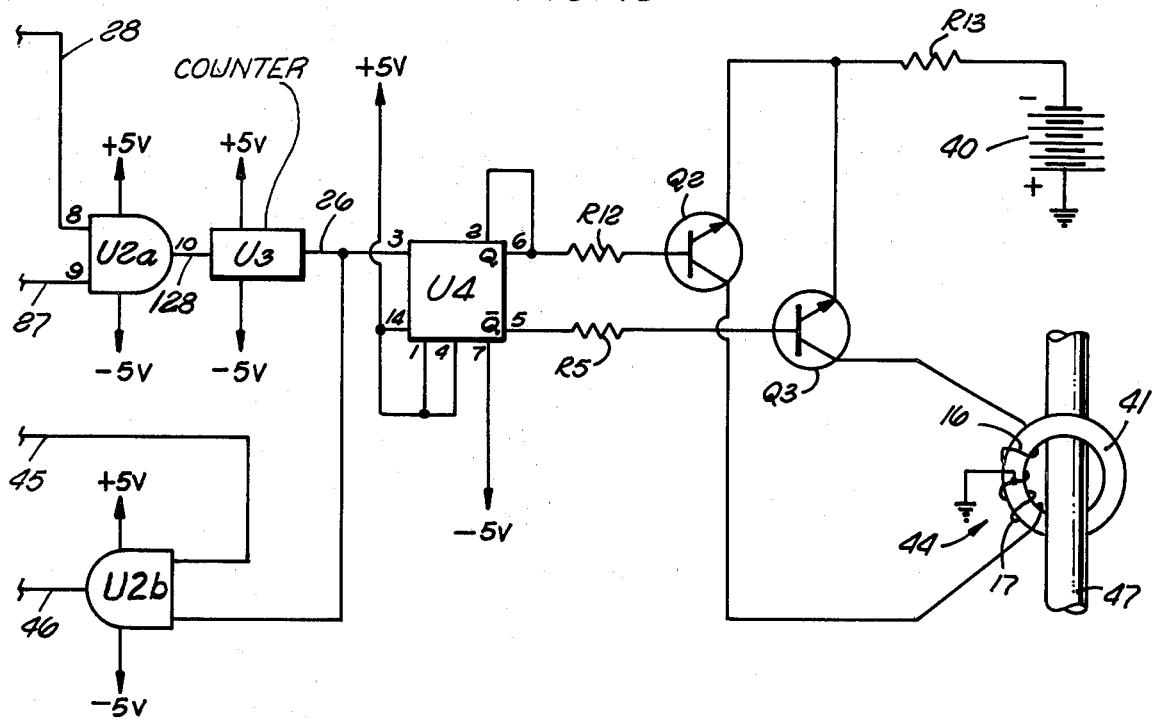

Referring first to FIGS. 1A and 1B, the voltage controlled oscillator circuit there shown is energized primarily by a closely regulated direct current power supply 10 having outputs 11, 12 and 13 maintained at +5 volts, 0 volts and −5 volts respectively. An input signal of varying voltage is supplied to the circuit from a unit 14 through a line 15. This unit 14 is energized by the same power supply 10 as are most of the components of the remainder of the circuit, and may typically be a sensor adapted to respond to a particular condition and produce an output voltage varying in accordance with changes in that condition. For example, the unit 14 may be a sensor within a directional drilling well instrument of the type shown in the above-identified copending application Ser. No. 902,687.

The instrument of that application includes two such sensors, one responding to changes in directional orientation of the instrument relative to the earth's magnetic field, and the other responding to changes in the "high side" angle of the instrument. Each of these sensors produces a direct current voltage level output typically varying between +3 volts and −3 volts in accordance with variations in the sensed condition.

The voltage controlled oscillator circuit of FIGS. 1A and 1B produces in two halves 16 and 17 of a toroidally wound center-tapped transformer coil 44 an oscillating output whose period and frequency are determined by, and represent in analog fashion, the variable level input voltage on line 15. Within the range of frequencies produced in coil 44, one particular central frequency represents and is produced by a zero voltage signal in line 15, while any higher frequency is a linear analog representation of a positive voltage in line 15, and a frequency lower than the predetermined central frequency is a linear analog representation of a negative voltage in line 15.

Two decoupling capacitors C1 and C2 may be connected between the three fixed voltage power lines 11, 12 and 13 as shown. The variable voltage signal in line 15 is first directed through an amplifying and filtering circuit 18, which produces a signal in the line 19 leading to a ramp generator or integrating circuit 20. A comparator 21 produces a signal in a line 22 when the voltage ramp in line 23 from the ramp generator passes a zero voltage condition. That signal in line 22 acts to simultaneously reset the ramp generator and condition an AND circuit U2a to deliver high frequency oscillations from a clock or base oscillator 24 to a programmable divide by N counter U3. Each time that counter U3 reaches a predetermined count, an output signal in a line 26 acts through an AND circuit U2b and two flip-flops U5a and U5b to simultaneously commence production of a next successive voltage controlled ramp by generator 20 and stop the count in counter U3. Further, each time counter U3 reaches its predetermined count, the output signal in line 26 actuates a bistable flip-flop U4 from one of its two stable states to the other state, with portion 16 of output coil 44 being energized in one of those states and portion 17 being energized in the other state.

To first describe in somewhat greater detail the initial amplifier circuit 18, this circuit may include a solid state amplifier chip A3, to which the variable voltage input signal from line 15 is delivered through a resistor R8. This input signal is connected to pin 2 of the amplifier circuit, while the zero voltage signal common input is connected to pin 3 of the amplifier, with the result that in line 19 leading from pin 6 there is produced an output voltage inverted with respect to the input in line 15. A frequency compensation capacitor C6, feedback resistor R4, low pass filtering capacitor C5 and offset balance adjustment potentiometer R11 may be connected to the appropriate pins of the amplifier as illustrated in FIG. 1. The movable contact of potentiometer R11 is connected to −5 volt input line 13.

Figure 2:
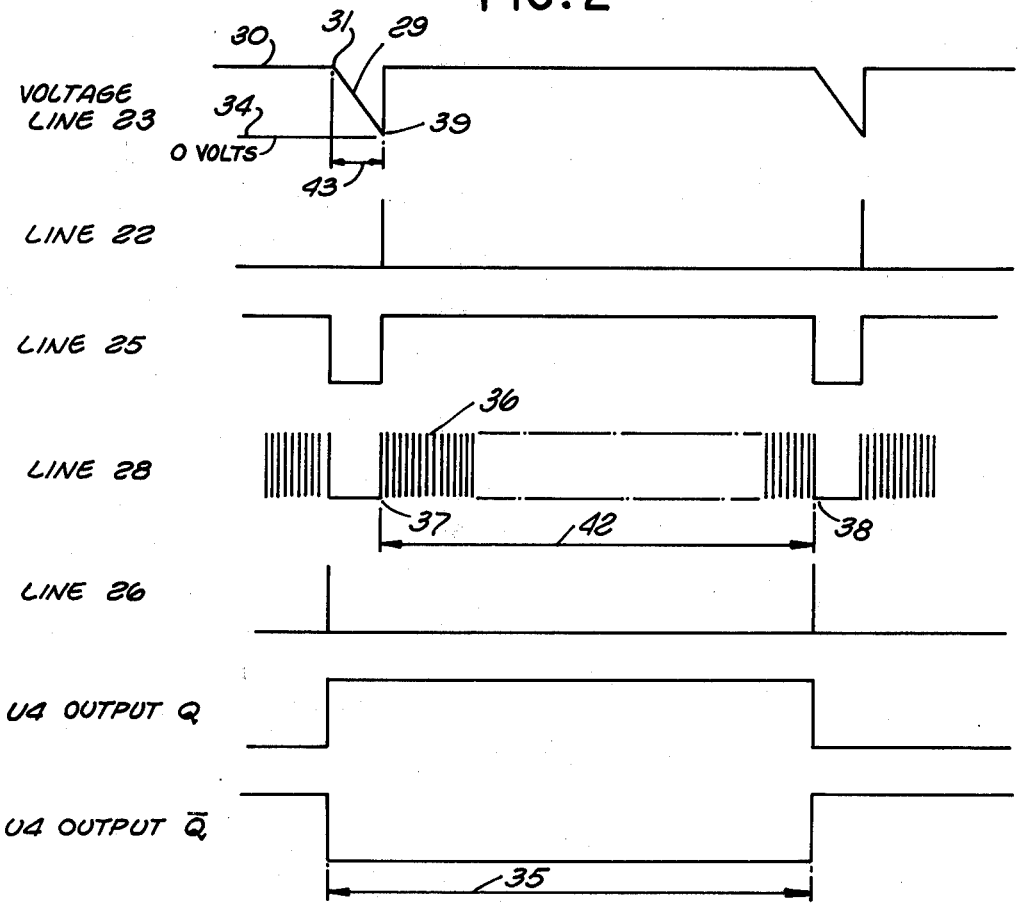
FIG. 2 is a chart illustrating the wave forms of the electrical signals at different points in the FIGS. 1A and 1B circuit.

The inverted output voltage from amplifier A3 controls the starting level of a ramp of progressively decreasing voltage produced by ramp generator 20. In FIG. 2, this ramp of decreasing voltage is represented at 29, and on each cycle of operation commences at a voltage level 30 corresponding to (actually inversely proportional to) the input voltage at that instant on input signal line 15. This voltage level 30 may typically vary between about +4 volts and −4 volts. The progressive decrease in voltage as represented by ramp 29 of FIG. 2 is initiated at the point 31 by reception of a "low" signal on a control line 32 connected to the ramp generator. This signal on line 32 is conducted through a resistor R6 to the base of a transistor Q1, which conducts only when the signal in line 32 is high, to, in that conductive condition, form a short circuit across capacitor C3 discharging the capacitor. When the signal in line 32 goes low, transistor Q1 becomes non-conductive, and capacitor C3 commences to charge, in a manner producing the discussed progressively decreasing ramp voltage in line 23.

Capacitor C3 is charged by an inverting amplifier A1, which may have a frequency compensation capacitor C4, and whose input pin 2 is connected as shown through resistors R2 and R3 to the +5 volt power supply line. The inverted output at pin 6 of amplifier A1 gradually goes negative as the capacitor C3 charges, with this decreasing ramp voltage being delivered through a resistor R10 to a junction 33 at which it is summed with the +5 volt potential delivered through a resistor R7 and the output signal from amplifier A3 delivered through resistor R9. The overall result is production in line 23 of the decreasing voltage ramp 29 of FIG. 2, commencing at a voltage level representing the value of the DC input signal in line 15 and initiated by delivery of a low signal to the ramp generator through line 32. The decreasing voltage ramp 29 slews from the initial positive voltage level 30 to a zero voltage level represented at 34 in FIG. 2, and upon crossing that zero voltage level to a very slightly negative condition actuates the comparator 21 to terminate the ramp and reset generator 20 to whatever level 30 represents the voltage then present in input line 15. The comparator 21 includes an inverting amplifier chip A2, connected as shown, with a stabilizing capacitor C8, and with a frequency compensation capacitor C7 connected to pins 1 and 8. When the input signal at pin 2 goes slightly negative as discussed, line 22 connected to the output pin 6 of amplifier A2 goes positive, to thereby deliver a 'set' pulse to the bistable flip-flop U5b. Such actuation of flip-flop U5b by a positive signal in line 22 produces a high signal in an output line 25 from the flip-flop U5b, acting through previously discussed line 32 to render transistor Q1 conductive and thereby terminate the ramp produced by generator 20 and reset that ramp generator to its initial condition represented by the level 30 in FIG. 2. The high signal in line 25 is also conducted through a line 27 to one of the inputs of the AND circuit U2a, the second of whose inputs comes from oscillator 24 to thus pass through the AND circuit and to line 128 leading to counter U3 the high frequency oscillations produced by oscillator 24.

Oscillator 24 may be any conventional fixed frequency oscillator, typically crystal controlled, and producing an output of a frequency extremely high as compared with the slew rate of ramp generator 20. That is, the frequency of oscillator 24 is great enough to produce a large number of oscillations in its output line 28 during a time interval equal to that occupied by a single decreasing voltage ramp produced by generator 20, when the input voltage in line 15 is at any value substantially above its lowest voltage condition. A presently preferred frequency for oscillator 24 is 2.237 megahertz. The conventional oscillator circuit typically illustrated in FIG. 1A includes a crystal Y1, a transistor Q4, resistors R1 and R14, and capacitors C9 and C10. Counter U3 is a solid state integrated circuit chip designed to function as a programmable divide by N circuit, which counts the oscillations passed to it from oscillator 24 up to a predetermined number for which the counter is set, and upon attainment of that count produces an output pulse in line 26 from the counter. This pulse combines with a high signal in line 25 and a connected line 45 to actuate the AND circuit U2b, for delivering a 'set' signal through a line 46 to bistable flip-flop U5a, which in turn delivers a reset signal to flip-flop U5b, returning the output line 25 to a low condition and at the same time resetting flip-flop U5a. The low signal in line 25 commences development of a next successive decreasing voltage ramp in line 23 from ramp generator 20, by rendering transistor Q1 non-conductive and thereby commencing charging of capacitor C3. The low signal in line 25 also turns off the AND circuit U2a, and thereby terminates the transmission of oscillations from oscillator 24 through circuit U2a to the counter.

Referring now again to FIG. 2, it will be apparent from this figure that the above cycle of operations has the effect of adding the predetermined fixed time period for which counter U3 is set (represented at 42 in FIG. 2) to the variable time period 43 determined by voltage level 30 from which ramp 29 commences its linear decrease in voltage, to produce a composite period 35 varying in accordance with the sum of the two component periods. In FIG. 2, the high frequency oscillations which are counted by counter U3 are represented at 36, and are initiated at the point 37 when AND circuit U2a is turned on, with the termination of the count being represented at 38 when the output signal in line 26 representing attainment of the predetermined count is produced. The point 37 at which the counter is turned on and commences to count is determined by the instant at which ramp 29 crosses the zero voltage line 34, as represented at 39 in FIG. 2. Similarly, the commencement of the downward ramp at 31 occurs when the count is completed at 38, so that each of the two component periods in effect commences the other, to produce the composite overall period 35.

The duration of this overall period 35 is taken from the counter by response to the output signals in line 26. More particularly, these timed output signals are delivered to bistable flip-flop U4, to alternatively actuate that flip-flop between its two stable states in which pulses are produced at its output pins 5 and 6 respectively. When a high signal is delivered from pin 5 through resistor R5 to the base of transistor Q3, this transistor becomes conductive, to pass current from a battery 40 through a series circuit including resistor R13 and the portion 16 of coil 44. Similarly, when transistor Q2 is turned on by delivery of a high signal from pin 6 of flip-flop 44 through resistor R13, current passes from the battery through resistor R13 to portion 17 of coil 44. The two portions 16 and 17 of coil 44 are connected to the battery reversely, so that the current which passes through portion 16 flows in a direction the opposite of the current flowing through portion 17, in a manner causing the two portions of the coil to produce together an oscillating magnetic flux in core 41. In the arrangement of the previously mentioned copending application Ser. No. 902,687, the annular core 41 and its toroidal center-tapped coil 44 are disposed about a well pipe 46, with the pipe then functioning in effect as part of a single turn secondary coil of the transformer assembly. The return path for that secondary coil is through the earth formation about the pipe. An alternating current is thus induced in the well pipe and earth at a variable frequency determined by the value of the input voltage signal in line 15.

In operation, the composite period 35 consisting of the sum of the fixed period 42 measured by counter U3 and the variable period 43 determined by the duration of the ramp 29 constitutes one-half of a cycle of the output current in coil 44, since the bistable flip-flop U4 has the effect of dividing the frequency by two and multiplying the period by two. As the input voltage in line 15 varies, the duration of ramp 29 varies correspondingly and linearly, to thus change the period in the output coil 44 between a minimum period condition determined by the count for which counter U3 is set and a maximum period condition when the voltage in line 15 is at a maximum. More specifically, if it is assumed that the voltage in line 15 varies from a positive 3 volts to a negative 3 volts, the positive 3 volt input signal results in development of a ramp 29 of maximum length, while a negative 3 volt input in line 15 produces a ramp of minimum length and preferably produces no ramp at all. A zero volt input level in line 15 produces a ramp of intermediate length. When a low negative voltage extinguishes the ramp completely, an output signal of minimum period and maximum frequency is produced in coil 44, with that period equalling two times the fixed duration period 42 for which counter U3 is preset. As the input voltage increases from that negative level, the length of ramp 29 increases, and the length of the composite period 35 correspondingly increases. The presence of the very precisely determined fixed duration component 42 in the output period assists in maximizing the stability and reliability of the circuit, and determines the minimum overall period of the circuit. Further, that range of output frequencies can be easily changed without major disruption of the circuit by merely turning the base or clock oscillator to any of various different oscillation frequencies. When the oscillator is thus changed in frequency, or another oscillator of a different frequency is substituted, counter U3 will attain its preset count in a different period of time, thus altering the length of the composite period represented at 35 in FIG. 2, and placing the output in a changed frequency range. Similarly, counter U3 may be reprogrammed to produce an output upon attainment of a changed count, to, in this way, shift the frequency range to any desired value.

It will of course be understood that the details of the circuit typically illustrated in FIG. 1 may be varied in numerous different ways, so long as the overall novelty covered in the appended claims is retained. The very specific circuitry shown in the drawings and described above has been included in this application for the purpose of disclosing a presently preferred form of the invention. To further assure a complete disclosure of that typical arrangement, I will list below the presently preferred electrical values for the various components of the circuit, and the type numbers and certain other information relating to the solid state components:

| | |
|---|---|
| Capacitors C1 and C2 | 0.01 microfarad each |
| Capacitor C3 | 0.01 microfarad |
| Capacitor C4 | 100 picofarad |
| Capacitor C5 | 0.1 microfarad |
| Capacitor C6 | 39 picofarad |
| Capacitor C7 | 100 picofarad |
| Capacitor C8 | 27 picofarad |
| Capacitor C9 | 27 picofarad |
| Capacitor C10 | 100 picofarad |
| Resistor R1 | 4.53 K |
| Resistor R2 | 20 K |
| Resistor R3 | 39.2 K |
| Resistor R4 | 301 K |
| Resistor R5 | 10 K |
| Resistor R6 | 20 K |
| Resistor R7 | 200 K |
| Resistor R8 | 274 K |
| Resistor R9 | 150 K |
| Resistor R10 | 49.9 K |
| Resistor R11 | 100 K |
| Resistor R12 | 10 K |
| Resistor R13 | 4 ohms |
| Resistor R14 | 100 K |
| Amplifiers A1 through A3 | Type CA3130B |
| Amplifiers A1 through A3 | Pin 7 of each is +5 volts |
| | Pin 4 of each is −5 volts |
| Circuits U2a and U2b | These circuits are a single integrated circuit CD4081B |
| Counter U3 | Type CD4059AD |
| Flip-flop U4 | Type 74C74 |
| Flip-flops U5a and U5b | Portions of a single Type CD 4013AD |
| Transistors Q1 and Q4 | Type 2N2222 |
| Transistor Q2 | Type T1P120 |
| Transistor Q3 | Type T1P120 |
| On U3 | Pins 3, 4, 6, 8, 11, 15, 20, 21, 22 and 24 are +5 volts |
| On U3 | Pins 2, 5, 7, 9, 10, 12, 13, 14, 16, 17, 18 and 19 are −5 volts |
| On U5 | Pins 9, 11, 5, 3 and 7 are −5 volts |
| On U2, U4 and U5 | Pin 14 is +5 volts and pin 7 is −5 volts |
| Crystal Y1 | Montor KTO-8 7724 |

| |
|---|
| 2.2370 MHz |

While a certain specific embodiment of the present invention has been disclosed as typical, the invention is of course not limited to this particular form, but rather is applicable broadly to all such variations as fall within the scope of the appended claims.

I claim:

1. A period-modulated voltage controlled oscillator comprising:

a base oscillator operating at a predetermined uniform frequency;

a counter operable to count a predetermined number of oscillations of said base oscillator, and acting to thereby measure a base time period corresponding in duration to said number of oscillations;

a ramp generator controlled by an input signal of varying voltage and acting to produce a voltage ramp continuing for a second period whose duration varies in accordance with variations in the voltage of said input signal;

means responsive to said counter and said ramp generator for combining said base time period and said second period into a combined period; and means controlled by said last mentioned means for producing an oscillating output signal having a period determined by said combined period.

2. A period-modulated voltage controlled oscillator comprising:

a base oscillator operating at a predetermined uniform frequency;

a counter operable to count a predetermined number of oscillations of said base oscillator, and acting to thereby measure a base time period corresponding in duration to said number of oscillations;

a ramp generator controlled by an input signal of varying voltage and acting to produce a voltage ramp continuing for a second period whose duration varies in accordance with variations in the voltage of said input signal;

means responsive to said counter and said ramp generator for combining said base time period and said second period into a combined period;

said means including means actuable by said counter upon termination of said base time period to commence production of said voltage ramp by said ramp generator; and means controlled by said means responsive to the counter and ramp generator for producing an oscillating output signal having a period determined by said combined period.

3. A period-modulated voltage controlled oscillator comprising:

a base oscillator operating at a predetermined uniform frequency;

a counter operable to count a predetermined number of oscillations of said base oscillator, and acting to thereby measure a base time period corresponding in duration to said number of oscillations;

a ramp generator controlled by an input signal of varying voltage and acting to produce a voltage ramp continuing for a second period whose duration varies in accordance with variations in the voltage of said input signal;

means responsive to said counter and said ramp generator for combining said base time period and said second period into a combined period;

said means including means actuable by said ramp generator upon expiration of said second period to commence counting of oscillations from said base oscillator by said counter; and means controlled by said means responsive to the counter and ramp generator for producing an oscillating output signal having a period determined by said combined period.

4. A period-modulated voltage controlled oscillator comprising:

a base oscillator operating at a predetermined uniform frequency;

a counter operable to count a predetermined number of oscillations of said base oscillator, and acting to thereby measure a base time period corresponding in duration to said number of oscillations;

a ramp generator controlled by an input signal of varying voltage and acting to produce a voltage ramp continuing for a second period whose duration varies in accordance with variations in the voltage of said input signal; and means responsive to said counter and said ramp generator for combining said base time period and said second period into a combined period;

said means including means actuable by said counter upon termination of said base time period to actuate said ramp generator in a relation commencing production of said voltage ramp thereby, and means actuable by said ramp generator upon expiration of said second period to actuate said counter to commence counting of oscillations from said base oscillator; and means controlled by said means responsive to the counter and ramp generator for producing an oscillating output signal having a period determined by said combined period.

5. A period-modulated voltage controlled oscillator comprising:

a base oscillator operating at a predetermined uniform frequency;

a counter operable to count a predetermined number of oscillations of said base oscillator, and acting to thereby measure a base time period corresponding in duration to said number of oscillations;

a ramp generator controlled by an input signal of varying voltage and acting to produce a voltage ramp continuing for a second period whose duration varies in accordance with variations in the voltage of said input signal;

means responsive to said counter and said ramp generator for combining said base time period and said second period into a combined period;

said means including a comparator acting to compare the voltage of said voltage ramp produced by said ramp generator with a predetermined fixed voltage and automatically responsive to attainment of said predetermined voltage by the ramp to commence counting of oscillations from said base oscillator by said counter; and means controlled by said means responsive to the counter and ramp generator for producing an oscillating output signal having a period determined by said combined period.

6. A period-modulated voltage controlled oscillator comprising:

a base oscillator operating at a predetermined uniform frequency;

a counter operable to count a predetermined number of oscillations of said base oscillator, and acting to thereby measure a base time period corresponding in duration to said number of oscillations;

a ramp generator controlled by an input signal of varying voltage and acting to produce a voltage ramp continuing for a second period whose duration varies in accordance with variations in the voltage of said input signal;

means responsive to said counter and said ramp generator for combining said base time period and said second period into a combined period;

said means including means actuable by said ramp generator upon termination of said second period to simultaneously reset the ramp generator and commence counting of oscillations from said base oscillator by said counter; and means controlled by said means responsive to the counter and ramp generator for producing an oscillating output signal having a period determined by said combined period.

7. A period-modulated voltage controlled oscillator comprising:

a base oscillator operating at a predetermined uniform frequency;

a counter operable to count a predetermined number of oscillations of said base oscillator, and acting to thereby measure a base time period corresponding in duration to said number of oscillations;

a ramp generator controlled by an input signal of varying voltage and acting to produce a voltage ramp continuing for a second period whose duration varies in accordance with variations in the voltage of said input signal;

means responsive to said counter and said ramp generator for combining said base time period and said second period into a combined period;

said means including a comparator acting upon termination of said second period to simultaneously reset said ramp generator and commence counting of oscillations from said base oscillator by said counter; and means controlled by said means responsive to the counter and ramp generator for producing an oscillating output signal having a period determined by said combined period.

8. A period-modulated voltage controlled oscillator comprising:

a base oscillator operating at a predetermined uniform frequency;

a counter operable to count a predetermined number of oscillations of said base oscillator, and acting to thereby measure a base time period corresponding in duration to said number of oscillations;

a ramp generator controlled by an input signal of varying voltage and acting to produce a voltage ramp continuing for a second period whose duration varies in accordance with variations in the voltage of said input signal;

means responsive to said counter and said ramp generator for combining said base time period and said second period into a combined period;

said means including a comparator automatically actuable by said ramp generator upon expiration of said second period to produce an output signal, a flip-flop actuable from a first state to a second state by said signal, and means operable by said flip-flop upon actuation to said second state to reset the ramp generator and commence counting of oscillations from the base oscillator by said counter; and means controlled by said means responsive to the counter and ramp generator for producing an oscillating output signal having a period determined by said combined period.

9. A voltage-controlled oscillator as recited in claim 8, in which said means responsive to the counter and ramp generator include also circuitry actuable by said counter upon expiration of said base time period to reset the flip-flop and simultaneously de-activate said counter and activate said ramp generator to commence production of a voltage ramp.

10. A voltage controlled oscillator as recited in claim 9, in which said means producing said oscillating output signal include a second flip-flop actuable between two different stable states by successive output signals from said counter.

11. A voltage controlled oscillator as recited in claim 9, in which said means producing said oscillating output signal include a second flip-flop actuable between two different stable states by successive output signals from said counter, and two oppositely wound coils energized by said second flip-flop in said two states respectively.

12. A period-modulated voltage controlled oscillator comprising:

a base oscillator operating at a predetermined uniform frequency;

a counter operable to count a predetermined number of oscillations of said base oscillator, and acting to thereby measure a base time period corresponding in duration to said number of oscillations;

a ramp generator controlled by an input signal of varying voltage and acting to produce a voltage ramp continuing for a second period whose duration varies in accordance with variations in the voltage of said input signal;

means responsive to said counter and said ramp generator for combining said base time period and said second period into a combined period; and means controlled by said means responsive to the counter and ramp generator for producing an oscillating output signal having a period determined by said combined period;

said last mentioned means including a flip-flop actuable between two stable states by successive output signals from said counter and acting to produce said oscillating output signal.

13. A period-modulated voltage controlled oscillator comprising:

a base oscillator operating at a predetermined uniform frequency;

a counter operable to count a predetermined number of oscillations of said base oscillator, and acting to thereby measure a base time period corresponding in duration to said number of oscillations;

a ramp generator controlled by an input signal of varying voltage and acting to produce a voltage ramp continuing for a second period whose duration varies in accordance with variations in the voltage of said input signal;

means responsive to said counter and said ramp generator for combining said base time period and said second period into a combined period;

said means including a comparator actuable by said ramp generator upon expiration of said second period determined by said voltage ramp, a first flip-flop actuable from a first stable state to a second stable state by said comparator on expiration of said second period and producing a switching signal when in said second state, an AND circuit actuable by said switching signal to pass oscillations from said base oscillator to said counter upon expiration of said second period, means delivering said switching signal to said ramp generator as a reset signal acting to reset the ramp generator, and a second AND circuit responsive to an output signal from said counter and said switching signal, and a reset flip-flop actuable by said second AND circuit to reset said first flip-flop; and means controlled by said means responsive to the counter and ramp generator for producing an oscillating output signal having a period determined by said combined period.

14. A voltage controlled oscillator as recited in claim 13, in which said means for producing an oscillating output signal include a third flip-flop actuable between two stable states by successive output signals from said counter.

15. A voltage controlled oscillator as recited in claim 14, including two oppositely wound coils energized by said third flip-flop in said two stable states respectively.

* * * * *